(12) United States Patent
Moyer et al.

(10) Patent No.: US 8,042,071 B2
(45) Date of Patent: Oct. 18, 2011

(54) CIRCUIT AND METHOD FOR AVOIDING SOFT ERRORS IN STORAGE DEVICES

(75) Inventors: William C. Moyer, Dripping Springs, TX (US); Troy L. Cooper, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 680 days.

(21) Appl. No.: 12/164,760

(22) Filed: Jun. 30, 2008

(65) Prior Publication Data

US 2009/0322411 A1    Dec. 31, 2009

(51) Int. Cl.
*G06F 17/50*    (2006.01)

(52) U.S. Cl. ........ 716/100; 716/105; 716/106; 716/110; 716/111; 716/112; 716/119; 716/122; 716/124

(58) Field of Classification Search .......... 716/100–112, 716/118–125
See application file for complete search history.

(56) References Cited

U.S. PATENT DOCUMENTS

| | | | |
|---|---|---|---|
| 6,825,691 B1 | 11/2004 | Chu et al. | |
| 6,826,090 B1 | 11/2004 | Chu et al. | |
| 6,882,201 B1 | 4/2005 | Koch, II et al. | |
| 6,930,527 B1 | 8/2005 | Cabanas-Holmen et al. | |
| 7,215,581 B2 | 5/2007 | Lotz et al. | |
| 2004/0205385 A1* | 10/2004 | Smith | 714/6 |
| 2006/0227596 A1 | 10/2006 | Thayer | |

* cited by examiner

*Primary Examiner* — Paul Dinh
(74) *Attorney, Agent, or Firm* — Joanna G. Chiu

(57) ABSTRACT

A storage element within a circuit design is identified. The storage element is replaced with both a first storage cell and a second storage cell. The second storage cell operates as a redundant storage cell to the first storage cell. An output of the first storage cell is connected to a first input of a comparator and an output of the second storage cell is connected to a second input of the comparator. The comparator provides an error indicator. Placement of the first storage cell, the second storage cell, the comparator, and one or more intervening cells is determined. The one or more intervening cells are placed between the first storage cell and the second storage cell. An integrated circuit is created using the comparator, the first storage cell, the second storage cell, the one or more intervening cells, and the determined placement.

20 Claims, 3 Drawing Sheets

NORMAL STORAGE CELL INSTANTIATION:

```
pos_reg #(1'b0, 1) reg_l1finv_tag_err(
    .async_reset    (sys_rst)
    .load_enable    (rd_l1finv_enable)
    .din            (l1finv_tag_err_latch)
    .clk            (clk),
    .q              (rd_l1finv_tag_err));
```

*FIG. 4*

REDUNDANT STORAGE CELL MACRO INSTANTIATION:

```
pos_redundant_reg #(1'b0, 1) reg_l1finv_tag_err(
    .async_reset    (sys_rst)
    .load_enable    (rd_l1finv_enable)
    .din            (l1finv_tag_err_latch)
    .clk            (clk),
    .q              (rd_l1finv_tag_err));
    .error          (glbl_err));
```

*FIG. 5*

CIRCUIT AND METHOD FOR AVOIDING SOFT ERRORS IN STORAGE DEVICES

BACKGROUND

1. Field

This disclosure relates generally to semiconductors, and more specifically, to storage circuits that are susceptible to soft errors.

2. Related Art

High energy neutrons are well known for having an adverse effect on the performance of semiconductors. High-energy neutrons bombard our planet from sources originating in deep space. As the neutrons enter earth's atmosphere they collide with a large amount of particulate matter and are split into multiple neutrons. While some energy is lost from the collisions, the sheer number of neutrons reaching ground level is noticeably increased. The neutrons lose energy in semiconductor materials through collisions with silicon nuclei that lead to a chain of secondary reactions. These reactions deposit a track of electron-hole pairs as they pass through a p-n junction. Some of the deposited charge recombines while some of the charge collects at p-n junction contacts. When a neutron particle strikes a sensitive region of a data storage circuit, such as at the gate of a charge storage device, the electrical charge that accumulates could exceed the minimum charge that is needed to reverse the data value that is stored in the data storage circuit. Reversal of stored data values is conventionally referred to as a "soft error". The term "SER" is referred to as a soft error rate. It is well documented that this effect varies with both latitude and altitude. Thus aviation electronics and other safety-critical applications are significantly impacted by the presence of soft errors. As integrated circuit dimensions continue to decrease, the incidence of soft errors is increasing. As a result, radiation induced soft errors are one of the main contributors to failure rates in high speed data processors and communications chips.

Other sources of soft errors are varied and include alpha particles which may be emitted by trace amounts of radioactive isotopes present in packing materials of integrated circuits. Alpha particles are capable of disturbing up to a five micron area of silicon and can readily modify the programmed state of a data storage device. Additionally, the conductive alloys that are used for the conductive bump in flip-chip packaging have also been identified as a possible source of alpha particles. Various semiconductor processes also tend to exhibit differing degrees of susceptibility to soft errors. For example, silicon-on-insulator (SOI) processes tend to be more reliable because charge that is dissipated into the substrate does not make it back into the glass insulator material to cause charge disturbances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 illustrates in diagram form a register transfer level (RTL) example of a design library cell for a storage device; and FIG. 5 illustrates in diagram form a register transfer level (RTL) example of a pseudo cell including a redundant storage device for selective replacement with the RTL cell of FIG. 4.

DETAILED DESCRIPTION

Figure 1:
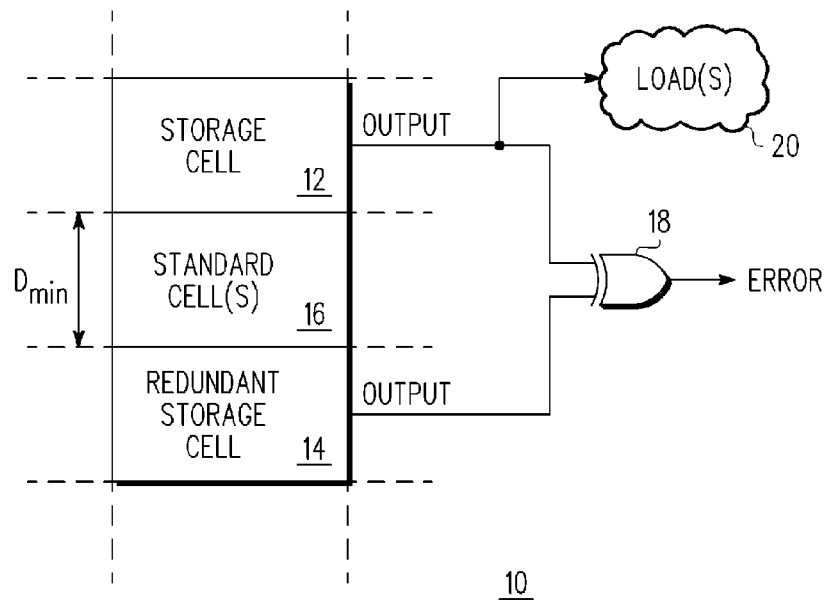
FIG. 1 illustrates in perspective form a semiconductor circuit with soft error compensation in accordance with one form of the present invention.

Illustrated in FIG. 1 is a circuit design 10 in an integrated circuit. The circuit design 10 uses standard cells. Included within the standard cells is a storage cell 12, a redundant storage cell 14 and one or more intervening standard cells 16. The storage cell 12 is separated in distance between the redundant storage cell 14 by a minimum separation distance designated as $D_{min}$ which is a predetermined distance that is assured of avoiding a soft error in both storage cells from a same soft error event. This distance is determined, in one form, empirically by making an engineering prototype or sample of the integrated circuit and testing various minimum distances to determine at what distance a soft error in one storage cell also modifies the other stored value in the other correlated storage cell. Each of storage cell 12 and redundant storage cell 14 has a data input (not shown) and an output. The output of storage cell 12 is connected to a first input of an exclusive OR gate 18 (XOR 18), and the output of redundant storage cell 14 is connected to a second input of exclusive OR gate 18. An output of exclusive OR gate 18 provides an error signal labeled "Error". The exclusive OR gate 18 functions as a comparator to compare the outputs of the storage cell 12 and the redundant storage cell 14. Each of storage cell 12 and redundant storage cell 14 is programmed to a same data value. Exclusive OR gate 18 functions to detect when the two output values are not the same data value. When the logic value of the bit values of storage cell 12 and redundant storage cell 14 differs, the error signal of exclusive OR gate 18 is asserted to indicate that one of the storage cells is programmed to an incorrect value. The output of the storage cell 12 is also connected to one or more load circuit(s) 20 for driving the one or more load circuit(s) 20 which may be additional circuitry.

In operation, each of the cells that form the storage cell 12, the one or more standard cells 16 and the redundant storage cell 14 is a cell in a standard cell library. Storage cell 12 and the redundant storage cell 14 are programmed with the same data value. The storage cell 12 is deemed to be a critical storage cell in the sense that its accurate operation is critical to the operation of the integrated circuit in which it operates. For example, in one application, a critical storage cell is a storage cell that is located in a data path and the integrity of the data is critical to accurate operation of the integrated circuit. In an alternate application, critical data may be one or more control state values stored in a storage cell. The storage cell 12 and redundant storage cell 14 are cells in a standard cell library having predetermined functions that are self-contained and require no modification by a circuit designer to implement the designated function. Standard cell libraries are used in software design tools used to create integrated circuit designs. For example, the storage cell in a standard cell library is a cell that implements a storage function. The storage cell 12 may be implemented as any of various storage circuits. Examples include a flip-flop, a latch, a register, or a dynamic or static memory cell including DRAM and SRAM. Other standard cell library cell functions include specific logic gates, a clock generator, a summer or adder, a comparator, a buffer, a delay element and other circuit functions. Once a value for $D_{min}$ has been calculated or empirically determined, any radiation impact that occurs within the physical boundary of the storage cell 12 will not extend further in distance than $D_{min}$. Therefore, the redundant storage cell 14 will not be affected by that same radiation event. If the radiation that hits storage cell 12 is significant enough to reverse the programmed bit of storage cell 12, the error signal will be asserted. In response to the error signal, additional circuitry (not shown) may be used to note that the data in storage cell 12 is not valid and requires re-programming. It should be noted that in the illustrated form the minimum separation distance between the storage cell 12 and the redundant storage cell 14 is efficiently utilized by other functional circuitry rather than being left as unused space. This efficient utilization of integrated circuit area provides a solution to the soft error phenomena without having unused portions of die area. Standard cells for circuitry unrelated to the storage cell and its associated input and output logic may be placed in the area between the storage cell and the redundant storage cell for efficient area utilization.

In one embodiment, another aspect of the circuit design 10 is the potential use of a larger storage cell 12 than the redundant storage cell 14. The storage cell 12 drives the XOR gate 18 and one or more load circuit(s) 20 and must therefore have a predetermined minimum drive strength. The redundant storage cell 14 does not have to drive any additional loads beyond XOR gate 18 and only needs to store a redundant programmed data bit. As a result, the circuitry used for the redundant storage cell 14 may differ from the circuitry used for the storage cell 12 and may be physically sized to be significantly smaller than the storage cell 12. Further, the type of storage circuit used to implement the redundant storage cell 14 may be a different type of memory device than the circuitry implemented in the storage cell 12. While FIG. 1 illustrates the storage cell 12 to be offset from a particular side of the redundant storage cell 14, it should be well understood that the positioning of these two cells may be from other sides of the cells with the $D_{min}$ separation distance and an intervening standard cell(s). Instead of an intervening standard cell(s) 16, it should also be understood that other circuitry, such as power bus routing or other communication links may occupy the area between storage cell 12 and redundant storage cell 14. It should be understood that a common control clock (not shown) is used for the storage cell 12 and the redundant storage cell 14.

In an alternate embodiment, storage cell 12 and redundant storage cell 14 may store opposite data values, and the XOR gate 18 may be replaced with an XNOR (exclusive-NOR) gate to generate the error signal. Storage of opposite values may provide for some benefits in certain circuit topologies and technologies, or may allow for area improvements or power improvements, including switching power and induced noise reduction.

Figure 2:
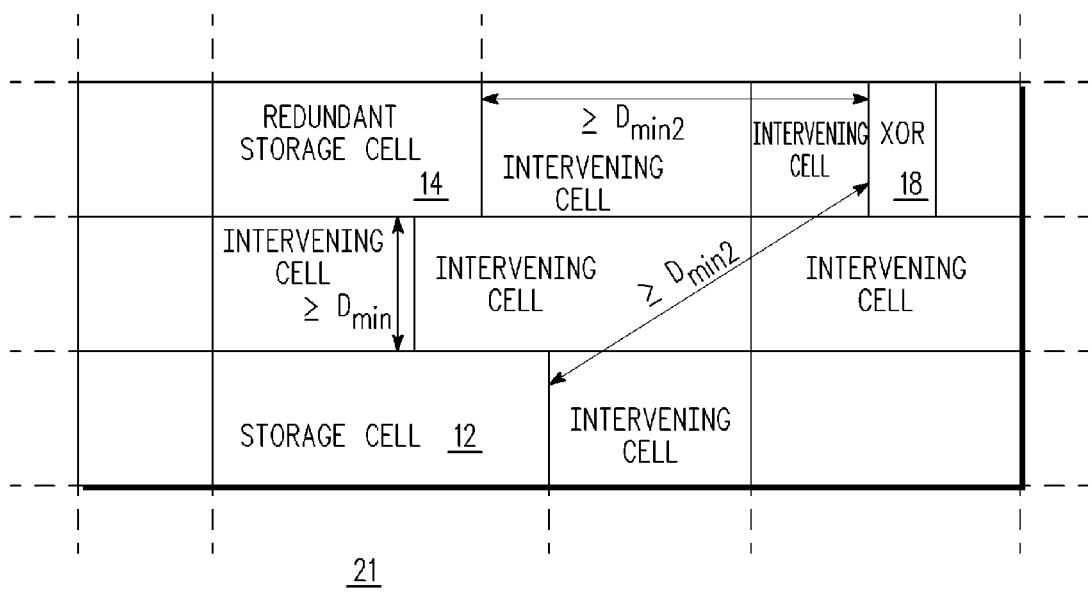
FIG. 2 illustrates in layout diagram form an exemplary layout of the semiconductor circuit of FIG. 1 in accordance with the present invention.

Illustrated in FIG. 2 is one form of a layout 21 of the circuit design 10 of FIG. 1 after the standard cells have been placed. The storage cell 12 is separated by the distance of $D_{min}$ from the redundant storage cell 14 by two intervening cells. A first intervening cell separates a first portion of sides of the storage cell 12 and the redundant storage cell 14. A second intervening cell separates a second portion of sides of the storage cell 12 and the redundant storage cell 14. It should be noted that in this embodiment the redundant storage cell 14 is physically smaller than the storage cell 12 since the redundant storage cell 14 does not need to drive the one or more load circuit(s) 20. The exclusive OR gate 18 (XOR gate 18) is optionally separated from each of the storage cell 12 and the redundant storage cell 14 by a distance labeled $D_{min2}$ so that a radiation event that creates a soft error in storage cell 12 or redundant storage cell 14 does not also affect the operation of exclusive OR gate 18. It should be understood that the distance between exclusive OR gate 18 and storage cell 12, $D_{min2}$, may or may not be the same as the distance between exclusive OR gate 18 and redundant storage cell 14. In some embodiments, $D_{min2}$ may be 0 and effectively no constraint on the placement of the exclusive OR gate 18 is present. In such a form the exclusive OR gate may be placed directly between storage cell 12 and redundant storage cell 14. It should be noted that the layout 21 of FIG. 2 is size efficient in that the desired separation distance are filled with other functional cells from a standard cell library. The intervening cells are cell functions that may also be memory storage cells having their own redundant cell protection (not shown) or may be cells with completely different circuit functions. Thus, the soft error indication method described herein may be implemented in a sea of standard memory cells (i.e. a sea of gates). Regardless of the functionality desired for the intervening cells, an efficient integrated circuit layout is described which will permit an efficient detection of a memory programming error, such as an error from a soft error, with an ability to readily avoid using wrong data. It should be noted that in one embodiment storage cell 12 and redundant storage cell 14 are clocked by a common clock signal. Alternate embodiments may use other clocking schemes.

Figure 3:
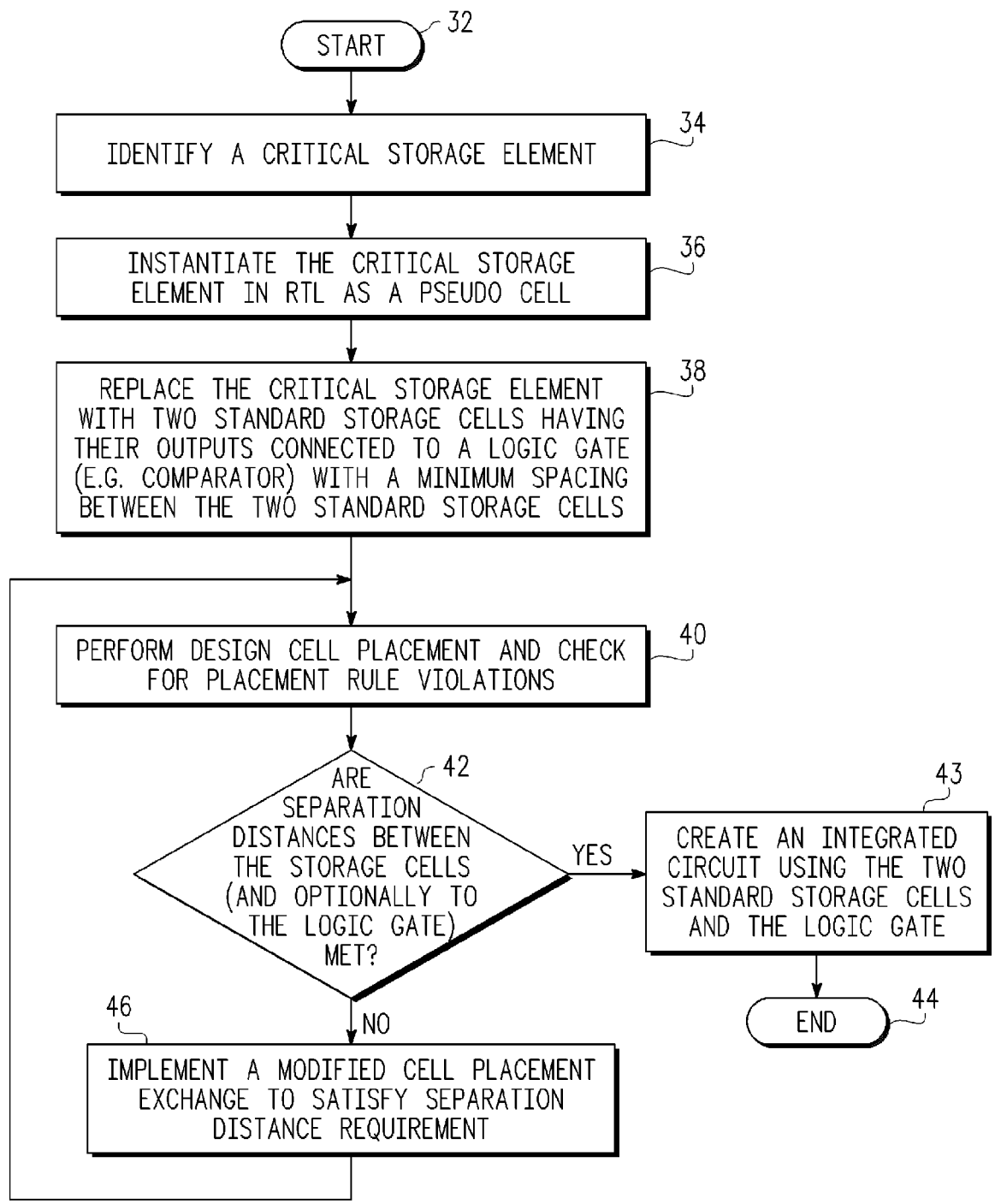
FIG. 3 illustrates in flowchart form a method to minimize soft errors in a storage element of a semiconductor circuit in accordance with the present invention.

Illustrated in FIG. 3 is a flowchart 30 that implements a method of creating an integrated circuit having data storage elements susceptible of soft errors. After a start step 32, a critical storage element is identified in a step 34. In one form the critical storage element is chosen as being a storage element in a critical data path. That is, if an error occurs in this data path the presence of the error detrimentally affects the result of the function of the integrated circuit. In another form the critical storage element may correspond to a critical control state or other type of information. Illustrated in FIG. 4 is an RTL example of an instantiation of a normal storage cell from a standard cell library. The first line of the RTL identifies the register by name (reg_I1finv_tag_err) and type (pos_reg). Other lines identify the signal names associated with critical functions such as the reset functionality, the enable functionality, the data input functionality, a clock signal identifier and the data output function. This RTL example is a conventional coding and as a result will not be further discussed.

Illustrated in FIG. 5 is an example of the RTL coding for the instantiation of a pseudo-cell (macro cell) which incorporates the redundant storage cell. The first line of the RTL identifies the pseudo-cell register by name (reg_I1finv_tag_err) and type (pos_redundant_reg). Other lines identify the signal names associated with critical functions such as the reset functionality, the enable functionality, the data input functionality, a clock signal identifier and the data output function, corresponding to the same signals of the standard cell element instantiation of FIG. 4. The RTL of FIG. 5 also provides for the generation of an error signal in response to the outputs of the two storage elements being connected to the logic gate. This RTL example is a conventional coding and as a result will not be further discussed. In a step 36 the identified critical storage element is instantiated as the RTL coding of the pseudo-cell (macro cell) illustrated in FIG. 5 which is not physically present in the standard cell library. In a step 38 the critical storage element is replaced with two standard storage cells from the standard cell library having their outputs connected to a standard cell logic gate (e.g. a comparator implemented as an XOR) with a minimum spacing between the two standard storage cells annotated or noted as a characteristic of the two standard storage cells. This annotation designates that a separation distance requirement is associated with that cell and the other cell to which the distance applies. The minimum spacing is the empirically determined minimum separation distance between the two storage elements that ensures that the effect of a same neutron radiation or alpha particle event affecting one of the storage elements does not also negatively affect the other storage element. In a step 40, design cell placement is performed by a design automation tool and a check is subsequently made to determine if any placement rule violations occurred. In a step 42 a determination is made as to whether the annotated separation distances between the storage cells and the comparator (logic gate) were satisfied. Optionally, a separation distance to the XOR gate 18 may also be checked if $D_{min2}$ is non-zero. If the separation distances were met, then in a step 43 an integrated circuit 43 is created using the two standard storage cells and the comparator (logic gate) upon which the method ends in a step 44. If the separation distances were not met, then in a step 46 a modified cell placement is implemented by modifying the positions of one or more of the storage cells and optionally the comparator. Their positions are exchanged with other cells in order to obtain the needed minimum separation distance(s). After the placement exchange occurs in step 46, a repeat of steps 40 and 42 occurs. Depending upon the result of decision step 42, further iterations of steps 46, 40 and 42 may or may not occur.

By now it should be appreciated that there has been provided a method and circuit having a layout for reliably detecting when data storage errors occur, including those caused by soft errors. The efficient use of area within a separation distance between a storage element and a redundant storage function element enables optimal use of circuit area while providing the detection function. The use of selective placement of a storage cell in a standard cell library and a redundant storage cell while using the circuit area separating these elements prevents multiple-errors from being induced into a data path by a single soft error event. The changing or annotation of a single storage element cell to two storage cells having a minimum separation distance prevents a single soft error radiation event from causing a soft error in both the storage cell and the redundant storage cell. This characteristic enables the circuitry to reliably detect when a soft error has occurred so that appropriate correction can be taken. The corrected action may be to ignore the erroneous data, implement an error correction technique or replace the erroneous data with valid data.

In one form there is herein provided a method for creating an integrated circuit. A storage element within a logic design is identified. The storage element is replaced with both a first storage cell and a second storage cell, wherein the second storage cell operates as a redundant storage cell to the first storage cell, and wherein an output of the first storage cell is connected to a first input of a comparator and an output of the second storage cell is connected to a second input of the comparator. The comparator provides an error indicator. Placement of the first storage cell, the second storage cell, the comparator, and one or more intervening cells is determined, wherein the one or more intervening cells are placed between the first storage cell and the second storage cell. The integrated circuit is created using the comparator, the first storage cell, the second storage cell, the one or more intervening cells, and the determined placement. In another form each of the first storage cell and the second storage cell is selected from a standard cell library. In another form the first storage cell and the second storage cell are a same standard cell type. In another form determining the placement of the first storage cell, the second storage cell, the comparator, and the one or more intervening cells is performed such that at least a predetermined minimum distance is maintained between the first storage cell and the second storage cell. In yet another form the predetermined minimum distance is determined such that a soft error event does not disturb the first storage cell and the second storage cell at a same time. In another form the first storage cell and the second storage cell are annotated with the predetermined minimum distance information, wherein the annotated predetermined minimum distance information is used for the determining the placement of the first storage cell, the second storage cell, the comparator, and one or more intervening cells. In another form determining the placement of the first storage cell, the second storage cell, the comparator, and the one or more intervening cells is performed such that at least a predetermined minimum distance is present between the first storage cell and the second storage cell, between the first storage cell and the comparator, and between the second storage cell and the comparator. In another form no cell immediately adjacent the first storage cell operates as a redundant storage cell to the first storage cell.

In yet another form there is provided a method for creating an integrated circuit. A storage element within a logic design is identified. The storage element is replaced with a logic gate and both a first storage cell and a second storage cell, wherein the second storage cell operates as a redundant storage cell to the first storage cell, and wherein an output of the first storage cell is connected to a first input of the logic gate and an output of the second storage cell is connected to a second input of the logic gate, the logic gate providing an error indicator. Placement of the first storage cell, the second storage cell, and the logic gate is determined, wherein at least a minimum distance is present between the first storage cell and the second storage cell, between the first storage cell and the logic gate, and between the second storage cell and the logic gate. The minimum distance is determined such that a soft error event does not disturb the logic gate, the first storage cell, and the second storage cell at a same time. The integrated circuit is created using the logic gate, the first storage cell, and the second storage cell and the determined placement. In another form each of the first storage cell and the second storage cell is selected from a standard cell library. In another form the first storage cell and the second storage cell are a same standard cell type. In another form one or more intervening cells are placed between the first storage cell and the second storage cell. In another form no cell immediately adjacent the first storage cell operates as a redundant storage cell to the first storage cell. In yet another form the logic gate performs a comparison function. In one form the logic gate is an exclusive OR gate.

In yet another form there is herein provided an integrated circuit having a first storage cell and a comparator, wherein the comparator provides a comparison output. A second storage cell operates as a redundant storage cell to the first storage cell, and an output of the first storage cell is connected to a first input of the comparator. An output of the second storage cell is connected to a second input of the comparator. The comparator provides the comparison output based on the first input and the second input of the comparator. One or more intervening cells are located between the first storage cell and the second storage cell. In another form at least a minimum distance is present between the first storage cell and a second storage cell such that a soft error event does not disturb the first storage cell and the second storage cell at a same time. In another form at least the minimum distance is present between the first storage cell and the comparator and between the second storage cell and the comparator. In yet another form one or more intervening cells are located between the first storage cell and the comparator. One or more intervening cells are located between the second storage cell and the comparator. In another form the first storage cell and the second storage cell are a same standard cell type.

Because the various apparatus implementing the present invention are, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention. It should be understood that all circuitry described herein may be implemented either in silicon or another semiconductor material or alternatively by software code representation of silicon or another semiconductor material.

Some of the above embodiments, as applicable, may be implemented using a variety of different information processing systems. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, circuit design 10 is implemented in any semiconductor having a data storage device independent of the type of semiconductor manufacturing process. Other embodiments may include any type of semiconductor bulk material. Any type of integrated circuit may be used in connection with the storage devices described herein.

Although the invention is described herein with reference to specific embodiments, various modifications and changes can be made without departing from the scope of the present invention as set forth in the claims below. For example, various types of storage devices may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for creating an integrated circuit, the method comprising:
    identifying, by using a design automation system, a storage element within a logic design;
    replacing the storage element with both a first storage cell and a second storage cell, wherein the second storage cell operates as a redundant storage cell to the first storage cell, and wherein an output of the first storage cell is connected to a first input of a comparator and an output of the second storage cell is connected to a second input of the comparator, the comparator providing an error indicator;
    determining placement of the first storage cell, the second storage cell, the comparator, and one or more intervening cells, wherein the one or more intervening cells are placed between the first storage cell and the second storage cell; and
    creating the integrated circuit using the comparator, the first storage cell, the second storage cell, the one or more intervening cells, and the determined placement.

2. The method of claim 1, further comprising:
    selecting each of the first storage cell and the second storage cell from a standard cell library.

3. The method of claim 2, wherein the first storage cell and the second storage cell are a same standard cell type.

4. The method of claim 1, wherein the determining the placement of the first storage cell, the second storage cell, the comparator, and the one or more intervening cells is performed such that at least a predetermined minimum distance is maintained between the first storage cell and the second storage cell.

5. The method of claim 4, further comprising:
    determining the predetermined minimum distance such that a soft error event does not disturb the first storage cell and the second storage cell at a same time.

6. The method of claim 5, further comprising:
    annotating the first storage cell and the second storage cell using the predetermined minimum distance, wherein the predetermined minimum distance is used for determining placement of the first storage cell, the second storage cell, the comparator, and one or more intervening cells.

7. The method of claim 1, wherein the determining the placement of the first storage cell, the second storage cell, the comparator, and the one or more intervening cells is performed such that at least a predetermined minimum distance is present between the first storage cell and the second storage cell, between the first storage cell and the comparator, and between the second storage cell and the comparator.

8. The method of claim 1, wherein no cell immediately adjacent the first storage cell operates as a redundant storage cell to the first storage cell.

9. A method for creating an integrated circuit, the method comprising:
- identifying, by using a design automation system, a storage element within a logic design;
- replacing the storage element with a logic gate and both a first storage cell and a second storage cell, wherein the second storage cell operates as a redundant storage cell to the first storage cell, and wherein an output of the first storage cell is connected to a first input of the logic gate and an output of the second storage cell is connected to a second input of the logic gate, the logic gate providing an error indicator;
- determining placement of the first storage cell, the second storage cell, and the logic gate, wherein at least a minimum distance is present between the first storage cell and the second storage cell, between the first storage cell and the logic gate, and between the second storage cell and the logic gate, and wherein the minimum distance is determined such that a soft error event does not disturb the logic gate, the first storage cell, and the second storage cell at a same time; and
- creating the integrated circuit using the logic gate, the first storage cell, and the second storage cell and the determined placement.

10. The method of claim 9, further comprising:
selecting each of the first storage cell and the second storage cell from a standard cell library.

11. The method of claim 10, wherein the first storage cell and the second storage cell are a same standard cell type.

12. The method of claim 9, further comprising:
placing one or more intervening cells between the first storage cell and the second storage cell.

13. The method of claim 12, wherein no cell immediately adjacent the first storage cell operates as a redundant storage cell to the first storage cell.

14. The method of claim 9, wherein the logic gate performs a comparison function.

15. The method of claim 9, wherein the logic gate comprises an exclusive OR gate.

16. An integrated circuit, comprising:
- a first storage cell;
- a comparator, wherein the comparator provides a comparison output;
- a second storage cell, wherein the second storage cell operates as a redundant storage cell to the first storage cell, and wherein an output of the first storage cell is connected to a first input of the comparator and an output of the second storage cell is connected to a second input of the comparator, wherein the comparator provides the comparison output based on the first input and the second input of the comparator; and
- one or more intervening cells located between the first storage cell and the second storage cell.

17. The integrated circuit of claim 16, wherein at least a minimum distance is present between the first storage cell and a second storage cell such that a soft error event does not disturb the first storage cell and the second storage cell at a same time.

18. The integrated circuit of claim 17, wherein at least the minimum distance is present between the first storage cell and the comparator and between the second storage cell and the comparator.

19. The integrated circuit of claim 16, further comprising:
- one or more intervening cells located between the first storage cell and the comparator; and
- one or more intervening cells located between the second storage cell and the comparator.

20. The integrated circuit of claim 16, wherein the first storage cell and the second storage cell are a same standard cell type.

* * * * *